(12) United States Patent
Tsien et al.

(10) Patent No.: US 7,818,626 B1
(45) Date of Patent: Oct. 19, 2010

(54) MEMORY ERROR INJECTOR AND ASSOCIATED METHODS

(75) Inventors: Louis Y. Tsien, Watertown, MA (US); Robert S. Moffett, Milton, MA (US)

(73) Assignee: Oracle America, Inc., Redwood City, CA (US)

( * ) Notice: Subject to any disclaimer, the term of this patent is extended or adjusted under 35 U.S.C. 154(b) by 445 days.

(21) Appl. No.: 11/622,739

(22) Filed: Jan. 12, 2007

(51) Int. Cl.
*G06F 11/00* (2006.01)
(52) U.S. Cl. .......................................... 714/41; 714/25
(58) Field of Classification Search .................. 714/41, 714/25, 42, 718
See application file for complete search history.

(56) References Cited

U.S. PATENT DOCUMENTS 5,499,249 A * 3/1996 Agrawal et al. ............. 714/736
2004/0187051 A1 * 9/2004 Berry et al. ................. 714/718
2005/0177778 A1 * 8/2005 Holian et al. ................ 714/42

* cited by examiner

*Primary Examiner*—Yolanda L Wilson
(74) *Attorney, Agent, or Firm*—Martine Penilla & Gencarella, LLP

(57) ABSTRACT

A memory error injector is defined to include a connector for enabling connection with a standard memory module receptacle. The memory error injector also includes a standard memory block defined to interface with the connector and operate in accordance with a standard memory specification. The memory error injector further includes error injection logic defined to force data transmitted to or from a specified memory location within the standard memory block to a fixed state, for a first number of access cycles addressed to the specified memory location. The error injection logic is defined to force the data to the fixed state during transmission of the data between the connector and the standard memory block.

16 Claims, 3 Drawing Sheets

MEMORY ERROR INJECTOR AND ASSOCIATED METHODS

BACKGROUND

By design, the natural rate at which memory errors occur in modern computer systems is very low. Additionally, computer system designers are continually seeking to further reduce the natural rate at which memory errors occur. Thus, in order to test the software whose purpose is to handle, correct, and/or diagnose such memory errors, it is not feasible to simply rely on the natural occurrence of memory errors. If the natural rate of memory error occurrence were used to test the memory error handling software, the software testing would take a very long time, and it would be difficult to tell if the memory error handling, correction, and diagnosis were in fact correct. In view of the foregoing, a solution is needed for generating artificial memory errors on demand and in a controlled manner.

SUMMARY

In one embodiment, a memory error injector is disclosed. The memory error injector includes a connector defined to connect the memory error injector to a standard memory module receptacle. The memory error injector also includes a standard memory block defined to interface with the connector and operate in accordance with a standard memory specification. The memory error injector further includes error injection logic defined to force data transmitted to or from a specified memory location within the standard memory block to a fixed state, for a first number of access cycles that are addressed to the specified memory location. The error injection logic is defined to force the data to the fixed state during transmission of the data between the connector and the standard memory block.

In another embodiment, a memory error injection system is disclosed. The system includes a standard memory module connector and a standard memory block. The system also includes a number of transistor switches disposed between the standard memory module connector and the standard memory block. The system further includes a programming interface defined to enable programming of a number of registers with memory error injection settings. The memory error injection settings include an address within the standard memory module, a forced state value, an access type, a frequency number, and a repetition number. Additionally, the system includes error injection logic defined to control the transistor switches to allow normal data transmission to or from the address for the frequency number of access cycles of access type. The error injection logic is also defined to control the transistor switches to force data transmitted to or from the address to the forced state value for the repetition number of access cycles of access type, following the frequency number of access cycles of access type.

In another embodiment, a method is disclosed for controlled memory error injection. The method includes a first operation for transmitting data to or from a standard memory module in a normal manner. The first operation is conducted for a first number of access cycles of a given type that are addressed to a designated memory location. Following the first number of access cycles of the given type, the method includes a second operation to force data transmitted to or from the designated memory location to have a specified value. The second operation is conducted for a second number of access cycles of the given type that are addressed to the designated memory location.

Other aspects of the invention will become apparent from the following detailed description, taken in conjunction with the accompanying drawings, illustrating by way of example the principles of the invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

Figure 1:
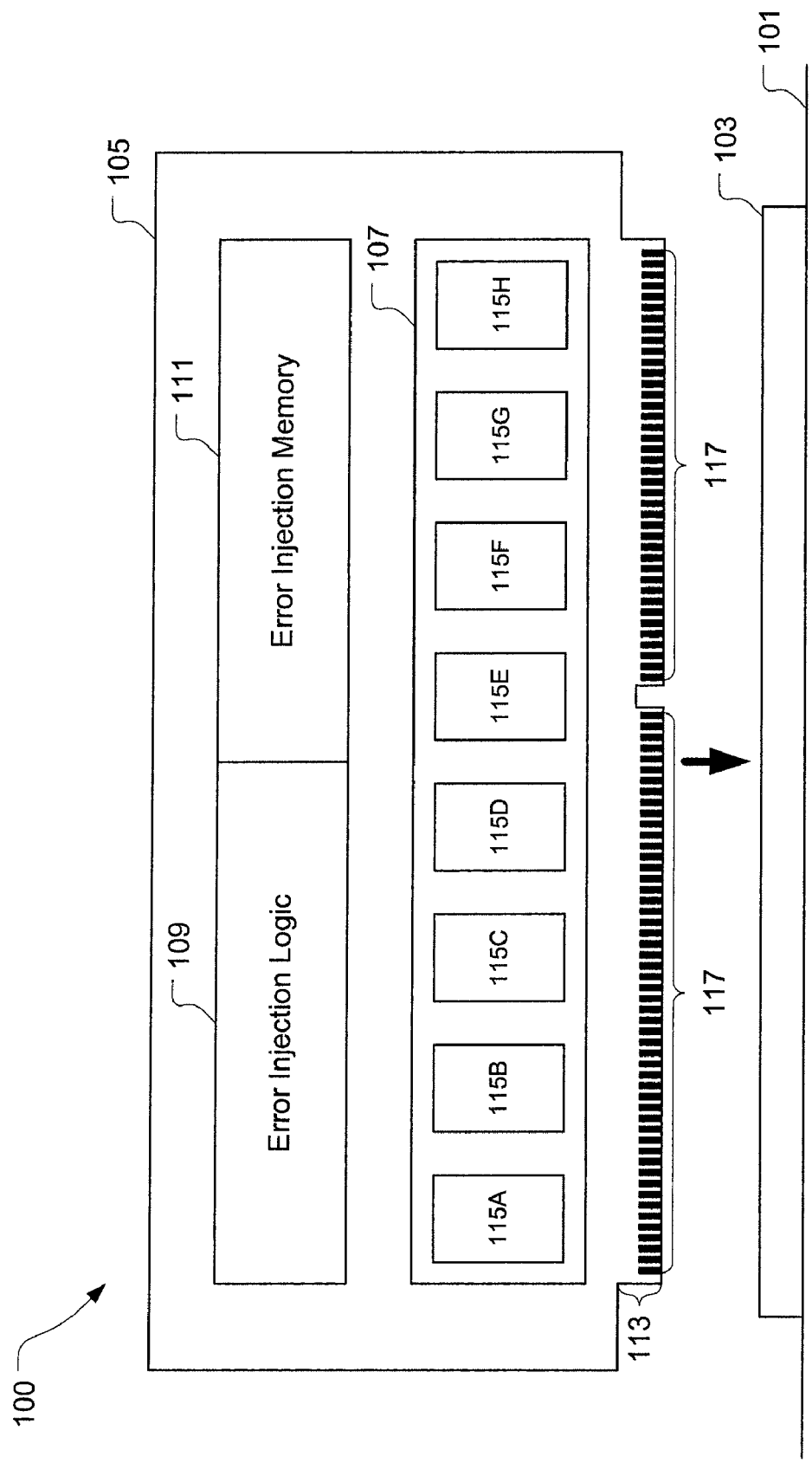
FIG. 1 is an illustration showing a memory error injector, in accordance with one embodiment of the present invention.

FIG. 1 is an illustration showing a memory error injector 100, in accordance with one embodiment of the present invention. The memory error injector 100 includes a connector 113 defined to connect the memory error injector 100 to a standard memory module receptacle 103. In one embodiment, the receptacle 103 is defined on a printed circuit board (PCB) 101 as part of a computing system. The memory error injector 100 includes a standard memory block 107 defined to interface with the connector 113 and operate in accordance with a standard memory specification. The memory error injector 100 further includes error injection logic 109 and error injection memory 111.

The error injection logic 109 is defined to force data transmitted to or from a specified memory location within the standard memory block 107 to a fixed state in a precisely controlled manner. Specifically, for a first number of access cycles of a specified type, i.e., read or write, that are addressed to the specified memory location, the error injection logic 109 will allow normal transmission of data to or from the specified memory location for a first number of access cycles of the specified type that are addressed to the specified memory location. Then, following the first number of access cycles, the error injection logic 109 will force the transmitted data to a fixed state, i.e., either a high state or a low state, for a second number of access cycles of the specified type that are addressed to the specified memory location. The error injection logic 109 is defined to force the data to the fixed state during transmission of the data between the connector 113 and the standard memory block 107. The error injection logic 109 is defined to sequentially and continuously repeat the sequence of allowing normal transmission of the data for the first number of access cycles followed by forcing the data to the fixed state for the second number of access cycles, until the error injection is disabled.

In one embodiment, a number of transistor switches are disposed between the connector 113 and the standard memory block 107 to enable forcing of the data to the fixed state during transmission of the data between the connector 113 and the standard memory block 107. For example, an array of field effect transistor (FET) switches can be disposed between the input/output (DQ) lines of the dynamic random access memory (DRAM) chips 115A-115H and the edge conductors 117 of the connector 113, thereby enabling the signal at the edge conductor 117 for each DQ line to be selectively forced to a high or low state by the error injection logic 109.

It should be appreciated that the standard memory block 107 and connector 113 can be defined as any type of Joint Electron Device Engineering Council (JEDEC) standard memory module, e.g., synchronous dynamic random access memory (SDRAM) or double data rate dual in-line memory module (DDR DIMM), among others. It should also be understood that with the error injection logic 109 in a disabled state, the memory error injector 100 functions as a standard memory module in accordance with the standard memory block 107 and connector 113 defined thereon.

Additionally, it should be understood that the particular connectivity between the connector 113 and the standard memory block 107, as described with regard to the memory error injector 100 of FIG. 1, is provided by way of example. In an another embodiment, the memory error injector 100 may include data lines that are not routed directly from the standard memory block 107 to the connector 113. For example, the connectivity between the standard memory block 107 and connector 113 can be defined as in a fully buffered DIMM (FBDIMM), wherein an advanced memory buffer (AMB) chip on the DIMM isolates memory chip address, control, and data lines from the connector 113 by converting signaling into high speed serial links. Even beyond the FBDIMM embodiment, however, it should be appreciated that the memory error injector 100 can be defined to include essentially any type of standard memory configuration.

The memory error injector 100 implements a programming interface to allow a user to select a row address, a column address, one or more bit line numbers, a frequency, and a repetition count at which to force one or more data bit values to 0 or 1, i.e., (low state or high state), thereby inducing a single or multiple bit memory error in a controlled manner. In one embodiment, the memory error injector 100 implements a non-standard extension of an inter-integrated circuit bus (I²C bus) to provide the programming interface through which memory error injection settings are specified. It should be understood that in this embodiment the error injection logic 109 and error injection memory 111 include the necessary I²C recognition logic and registers necessary to implement the programming interface. Also, the programming interface implemented by the memory error injector 100 includes a number of fields for specifying the memory error injection settings. In one embodiment, the addresses for the fields used to specify the memory error injection settings are outside the standard JEDEC-defined address range.

Figure 2:
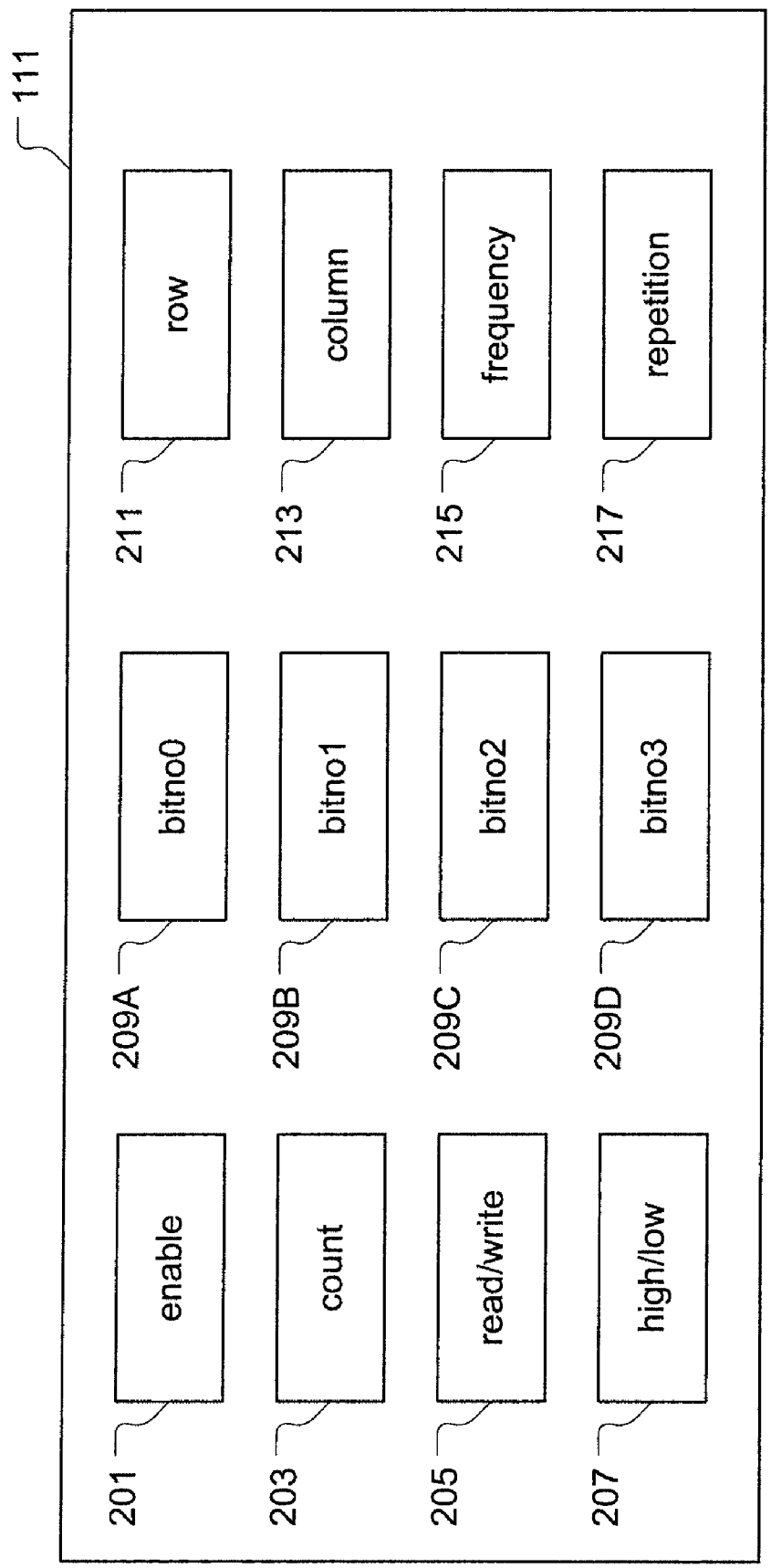
FIG. 2 is an illustration showing the error injection memory, in accordance with one embodiment of the present invention.

FIG. 2 is an illustration showing the error injection memory 111, in accordance with one embodiment of the present invention. The error injection memory 111 includes a number of registers for storing the memory error injection settings. A single bit enable register 201 is provided to store an enable flag. In one embodiment, the error injection logic 109 is disabled when the enable flag is set to 0. Thus, in this embodiment no memory error injection will occur unless the enable flag is set to 1. A single bit read/write register 205 is provided to store an access type, i.e., read or write, to be counted during the memory error injection operation. For example, in one embodiment, a read/write register 205 setting of 0 means count read access cycles, and a read/write register 205 setting of 1 means count write access cycles. Based on the read/write register 205 setting, the error injection logic 109 will cause data misrepresentation to occur on either a read access cycle or a write access cycle basis. A single bit high/low register 207 is provided for storing a forced state value, i.e., 0 or 1. The forced state value represents the state to which affected bit values are to be forced during memory error injection.

The error injection memory 111 also includes four bit number registers (bitno0 209A through bitno3 209D). Each bit number register 209A-209D is used to designate a bit position upon which a memory error is to be injected. In one embodiment, each bit number register 209A-209D is defined as a one byte register capable of designating a bit position between 0 and 255. In other embodiments, the size of the bit number registers can vary, but should preferably allow for specification of the maximum bit position available in the standard memory block 107. A two bit count register 203 is provided for designating which bit number registers 209A-209D are to be used to provide the bit position upon which a memory error is to be injected. Additionally, a two byte row address register 211 is provided for storing a row address within the standard memory block 107 to which the memory error is to be injected. A two byte column address register 213 is also provided for storing a column address within the standard memory block 107 to which the memory error is to be injected.

A four byte frequency register 215 is provided to store a frequency number. The frequency number represents a number of access cycles of the type designated by the read/write register 205 that will occur between successive memory error injection sequences. Thus, the frequency number is a way of specifying how steady the memory error should appear. For example, a frequency number of zero means that the memory error should occur all the time. A frequency number of 10 means that 10 access cycles of the type designated by the read/write register 205 should occur between each memory error injection sequence. A four byte repetition register 217 is also provided for storing a repetition number. The repetition number represents a number of successive access cycles of the type designated by the read/write register 205 in which the memory error is to be injected for a given memory error injection sequence. Thus, the repetition number represents how many successive instances of the error will be injected when the error is to be introduced.

While the enable register 201 is set to disable the memory error injection process, the various memory error injection settings are stored, i.e., initialized, in the error injection memory 111. Specifically, through the programmable interface of the memory error injector 100, a user programs desired values into each of the read/write register 205, the high/low register 207, the bit number registers 209A-209D, the count register 203, the row address register 211, the column address register 213, the frequency register 215, and the repetition register 217. Once the various memory error injection settings are stored in the error injection memory 111, the enable register 201 is set to enable the memory error injection process, thereby initiating the memory error injection process.

Once the memory error injection settings are initialized and the memory error injection process is enabled, the error injection logic 109 functions to allow passage of normal data, i.e., application data, between the connector 113 and the standard memory block 107 for the number, as indicated by the frequency register 215, of access cycles of the type indicated by the read/write register 205 that are addressed to the specific memory location indicated by the row address register 211 and column address register 213. Then, for the next number, as indicated by the repetition register 217, of access cycles of the type indicated by the read/write register 205 that are addressed to the specific memory location indicated by the row address register 211 and column address register 213, the error injection logic 109 functions to force the data at the bit position, indicated by the count register 203 and bit number registers 209A-209D, to the state indicated by the high/low register 207.

The above cycle of passing normal data for the frequency register 215 number of access cycles, followed by forcing data to the high/low register 207 state for the repetition register 217 number of cycles, continues until the enable register 201 is set to disable the memory error injection process. In the above memory error injection process, it should be understood that both the frequency register 215 number of access cycles and the repetition register 217 number of access cycles correspond to access cycles of the type indicated by the read/write register 205 that are addressed to the specific memory location indicated by the row address register 211 and column address register 213. Additionally, in the above error injection process, for each of the repetition register 217 number of access cycles, it should be understood that the one or more bit positions to which errors are injected are designated by the values stored in the count register 203 and bit positions registers 209A-209D.

While the memory error injection process is enabled, independently operating software for handling memory errors can be monitored and evaluated. It should be appreciated that the memory error injector 100 enables on-demand artificial introduction of memory errors in a controlled and known manner. Thus, to facilitate testing of software designed to handle memory errors, the memory error injector 100 enables creation, i.e., injection, of specific types of memory errors on-demand so that the software's capability to handle the injected memory errors can be effectively monitored and evaluated.

Figure 3:
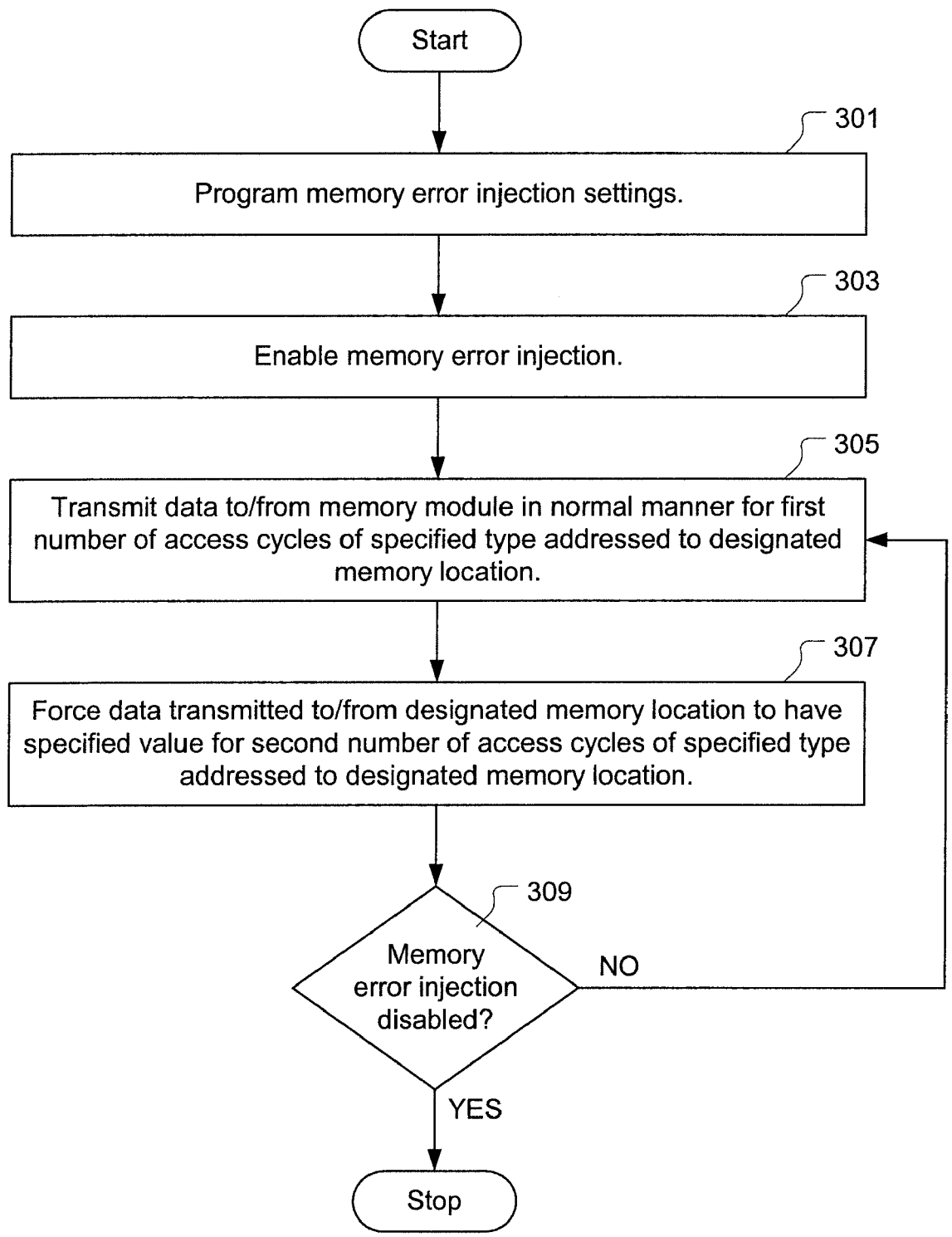
FIG. 3 is an illustration showing a flowchart of a method for controlled memory error injection, in accordance with one embodiment of the present invention.

FIG. 3 is an illustration showing a flowchart of a method for controlled memory error injection, in accordance with one embodiment of the present invention. The method includes an operation 301 for programming memory error injection settings prior to initiating the controlled memory error injection. Operation 301 includes storing data specifying the designated memory location upon which the memory error injection is to be based. Storing of the designated memory location can be performed by storing appropriate values in the row address register 211 and column address register 213, as previously discussed with regard to the error injection memory 111. Operation 301 also includes storing data specifying the given type of access cycle, such as previously discussed with regard to the read/write register 205.

The programming of operation 301 further includes storing data specifying the state to which data is to be forced for error injection, such as previously discussed with regard to the high/low register 207. Operation 301 also includes storing data specifying the number of access cycles (of the specified type) in which data is to be transmitted normally between the connector 113 and standard memory block 107, such as previously discussed with regard to the frequency register 215. Operation 301 also includes storing data specifying the number of access cycles (of the specified type) in which data at one or more designated bit positions is to be forced to the indicated state, such as previously discussed with regard to the repetition register 217. Operation 301 also includes storing data specifying the one or more bit positions to which memory errors are to be injected.

Following operation 301, the method continues with an operation 303 for enabling the memory error injection. In one embodiment, the memory error injection is enabled by setting an enable flag, such a previously discussed with regard to the enable register 201. Upon enabling the memory error injection process in operation 303, an operation 305 is performed to transmit data to or from a standard memory module in a normal manner for a first number of access cycles of a given type addressed to a designated memory location. With reference to FIG. 1, operation 305 transmits data between the connector 113 and the standard memory block 107 in the normal manner. With reference to FIG. 2, the first number of access cycles in operation 305 corresponds to the number stored in the frequency register 215, and the given type of access cycle is indicated by the value stored in the read/write register 205. Also, with reference to FIG. 2, the designated memory location of operation 305 is identified by the values stored in the row address register 211 and the column address register 213.

Following operation 305, the method proceeds with an operation 307 in which data transmitted to or from the designated memory location is forced to have a specified value for a second number of access cycles of the given type addressed to the designated memory location. With reference to FIG. 1, operation 307 forces the data to the specified value in transit between the connector 113 and the standard memory block 107. With reference to FIG. 2, one or more specific bit positions to be forced to the specified value in operation 307 are designated by the values stored in the count register 203 and bit number registers 209A-209D. With reference to FIG. 2, the specified value, i.e., state, to which the data is to be forced in operation 307 is indicated by the value stored in the high/low register 207. With reference to FIG. 2, the second number of access cycles in operation 307 corresponds to the number stored in the repetition register 217, and the given type of access cycle is indicated by the value stored in the read/write register 205. Also, with reference to FIG. 2, the designated memory location of operation 307 is identified by the values stored in the row address register 211 and the column address register 213.

Following operation 307, the method proceeds with an operation 309 to determine whether the memory error injection is disabled. With reference to FIG. 2, operation 309 can be performed by checking the status of the enable register 201. If operation 309 indicates that the memory error injection is not disabled, the method reverts back to operation 305. If operation 309 indicates that the memory error injection is disabled, the method concludes. Operation 309, as depicted in FIG. 3, indicates that the enablement of the memory error injection process is queried after completion of the repetition register 217 number of access cycles. However, it should be understood that in other embodiments, the enable register 201 can be continuously monitored such that the memory error injection process can be disabled at any point within or between operations 305 and 307. Additionally, in one embodiment, the method of FIG. 3 can be under software control to enable automated execution of a number of memory error handling tests.

The memory error injector 100 is distinguishable from other memory error injection techniques in a variety of ways. For example, consider an alternate memory error injection technique in which a standard DIMM is physically modified such that the PCB etch for one or more data lines is cut and a small toggle switch is wired to opposite sides of each cut. For ease of discussion, the aforementioned alternate memory error injection technique is referred to as a "hardwired DIMM."

In contrast to the hardwired DIMM, the memory error injector 100 makes it feasible to cover all data lines of the memory module in a programmable manner, rather than only those data lines that are manually cut. In further contrast to the hardwired DIMM, the memory error injector 100 makes it possible to simulate a memory module having transient or intermittent errors, as well as hard errors, which is important for memory error handling software testing diagnosis. In contrast to the hardwired DIMM, the memory error injector 100 makes it possible to automate the testing of a set of conditions, rather than requiring human intervention to change switch settings, which introduces the possibility of misrunning test conditions. In contrast to the hardwired DIMM, the memory error injector 100 is capable of preventing a continuous stream of errors, which in some cases can overwhelm an operating system's capability of tracking, correcting, and reporting multiple memory errors.

The memory error injector 100 is also distinguishable from an alternate memory error injection technique in which special hardware features of a processor or memory controller, outside the memory module itself, are used to deliberately set off, i.e., trigger, an error detector within the memory controller. For ease of discussion, the aforementioned alternate memory error injection technique is referred to as "error detector triggering."

In contrast to error detector triggering, the memory error injector 100 does not require special hardware features to be designed into a processor or memory controller to enable triggering of an error detector within the memory controller. It should be appreciated that such special hardware features may not have been included in the processor or memory controller design due to cost or other considerations, and that retrofitting of the special hardware features is generally cost prohibitive. Also in contrast to error detector triggering, the memory error injector 100 is not subject to any inherent limitations of such special hardware features. For example, the memory error injector 100 does not require that data on quadwords within a cache line be identical. Inherent limitations of special hardware features associated with error detector triggering can make it difficult or impossible to inject memory errors into standard software applications, as opposed to specifically tailored "error injector" applications, or to test memory error handling and diagnosis under conditions of heavy system load, i.e., stress test.

Also, the memory error injector 100 can simulate certain error conditions which are difficult or impossible to simulate using error detector triggering, such as certain kinds of transients, leaky cells, or hard errors, i.e., stuck-at errors. The memory error injector 100 provides assurance that physical attributes of the memory error location, such as bit number and slot designation, are correctly recognized. In contrast to the memory error injector 100, the error detector triggering technique does not exercise the datapath between the memory module and the memory controller. Thus, a labeling mistake on the datapath between the memory module and the memory controller cannot be detected by the error detector triggering technique, whereas the labeling mistake can be detected using the memory error injector 100.

Additionally, in comparison with the error detector triggering technique, the memory error injector 100 more closely exercises the physical implementation of the memory. For example, direct triggering of an error detector in the memory controller cannot guarantee where the triggered error is physically mapped within the design implementation. Thus, in contrast to the error detector triggering technique, the memory error injector 100 is completely trustworthy in verification of correlating error reporting to the physical bit lane location on a given PCB.

Furthermore, the memory error injector 100 can provide more thorough coverage of possible memory errors as compared to a software controlled error detector triggering technique. A software controlled error detector triggering technique can test for every bit that is defined by the software, but this does not guarantee that every bit has truly been covered. For example, failing bits that are spare don't cares when the memory module is populated in one slot may be overlooked by the software controlled error detector triggering technique, but these failing bits may show up when the memory module is populated in another slot. Thus, as compared to the error detector triggering technique, the memory error injector 100 can provide a better understanding of the specific aspects of the memory error handing software that are tested.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory error injector, comprising: a connector defined to connect the memory error injector to a standard memory module receptacle; a standard memory block defined to interface with the connector and operate in accordance with a standard memory specification; an error injection memory defined to store settings for a specified memory location within the standard memory block, a fixed logic state, a first number of access cycles, and a second number of access cycles; and error injection logic defined to allow normal transmission of data to or from the specified memory location for the first number of access cycles addressed to the specified memory location and force data transmitted to or from the specified memory location within the standard memory block to the fixed logic state for the second number of access cycles addressed to the specified memory location, wherein the first number of access cycles immediately precedes the second number of access cycles, wherein the error injection logic is defined to sequentially and continuously repeat a sequence of allowing normal transmission of data to or from the specified memory location for the first number of access cycles followed by forcing data transmitted to or from the specified memory location for the second number of access cycles, and wherein the error injection logic is defined to force the data to the fixed logic state during transmission of the data between the connector and the standard memory block.

2. A memory error injector as recited in claim 1, wherein the settings for the specified memory location include a row address of the standard memory block and a column address of the standard memory block.

3. A memory error injector as recited in claim 1, wherein the error injection memory further includes a register for designating the first and second access cycles to be either read cycles or write cycles.

4. A memory error injector as recited in claim 1, wherein the error injection logic is defined to operate in accordance with an enable signal.

5. A memory error injector as recited in claim 1, wherein the error injection logic includes a number of transistor switches disposed between the connector and the standard memory block to enable forcing of the data to the fixed logic state during transmission of the data between the connector and the standard memory block.

6. A memory error injection system, comprising:
a standard memory module connector;
a standard memory block;
a number of transistor switches disposed between the standard memory module connector and the standard memory block;
a programming interface defined to enable programming of a number of registers with memory error test settings including,
an address within the standard memory module,
a forced state value,
an access type,
a frequency number representing a number of access cycles of the programmed access type during which normal data transmission is allowed to or from the programmed address within the standard memory module, and
a repetition number representing a number of access cycles of the programmed access type during which transmitted data is forced to the programmed forced state value; and
error injection logic defined to
(a) control the number of transistor switches to allow normal data transmission to or from the address for the frequency number of access cycles of access type, and
(b) following the frequency number of access cycles of access type, control the number of transistor switches to force data transmitted to or from the address to the forced state value for the repetition number of access cycles of access type.

7. A memory error injection system as recited in claim 6, wherein the memory error test settings include an enable flag, the error injection logic defined to perform operations (a) and (b) in a sequentially repetitive manner when the enable flag is set to enabled, the error injection logic defined to allow normal operation of the standard memory block when the enable flag is set to disabled.

8. A memory error injection system as recited in claim 6, wherein the programming interface is defined to enable specification of the address by a row address and a column address within the standard memory module.

9. A memory error injection system as recited in claim 6, wherein the forced state value is either a high state or a low state, and the access type is either a read access or a write access.

10. A memory error injection system as recited in claim 6, wherein the standard memory module connector, the standard memory block, the number of transistor switches, the programming interface, and the error injection logic is collectively defined as a single device.

11. Method for controlled memory error injection, comprising:
(a) transmitting data to or from a standard memory module in a normal manner for a first number of access cycles of a given type addressed to a designated memory location;
(b) following the first number of access cycles of the given type, forcing data transmitted to or from the designated memory location to have a specified value for a second number of access cycles of the given type addressed to the designated memory location; and
(c) initiating the controlled memory error injection by setting an enable bit to a first state; and
(d) performing operations (a) and (b) in a sequentially repetitive and continuous manner while the enable bit is set to the first state; and
(e) ceasing operations (a) and (b) when the enable bit is set from the first state to a second state.

12. Method for controlled memory error injection as recited in claim 11, wherein the data transmitted to or from the standard memory module in the normal manner is generated by or requested from, respectively, an application utilizing the standard memory module.

13. Method for controlled memory error injection as recited in claim 11, wherein the given type of access cycle is either a read access cycle or a write access cycle.

14. Method for controlled memory error injection as recited in claim 11, wherein the data transmitted to or from the designated memory location corresponds to one or more bits of data, and the specified value to which each of the one or more bits of data is forced is either a high state or a low state.

15. Method for controlled memory error injection as recited in claim 11, further comprising:
specifying the designated memory location by a row address and a column address within the standard memory module; and
specifying one or more bit positions within the standard memory module carrying the data to be forced to the specified value.

16. Method for controlled memory error injection as recited in claim 11, further comprising:

programming memory error injection settings prior to initiating the controlled memory error injection, wherein the programming includes,
storing data specifying the designated memory location,
storing data specifying the given type of access cycle,
storing data specifying the specified value to which data is to be forced,
storing data specifying the first number of access cycles, and
storing data specifying the second number of access cycles.

* * * * *